United States Patent [19]
Porawski

[11] 3,851,259
[45] Nov. 26, 1974

[54] DEADZONE CIRCUIT

[75] Inventor: Donald John Porawski, Bayonne, N.J.

[73] Assignee: The Bendix Corporation, Teterboro, N.J.

[22] Filed: Mar. 30, 1973

[21] Appl. No.: 347,244

[52] U.S. Cl. .............. 328/143, 307/230, 307/235 R, 328/147, 330/1 A, 330/51, 330/124 R
[51] Int. Cl. .............. G06g 7/12
[58] Field of Search .......... 330/1 A, 3 R, 41, 124 R; 318/624; 307/230, 235 R; 328/143, 147

[56] References Cited

UNITED STATES PATENTS 3,569,738 3/1971 Osborne .............................. 307/235
3,736,486 5/1973 Gould et al. ......................... 318/624

*Primary Examiner*—James B. Mullins
*Attorney, Agent, or Firm*—Anthony F. Cuoco; S. H. Hartz

[57] ABSTRACT

An improved deadzone circuit includes a pair of amplifiers initially saturated in opposite senses and another amplifier driven thereby to provide a null output until an input to the pair of amplifiers exceeds predetermined deadzone levels, whereupon the output of the other amplifier follows the output of the pair of amplifiers applied through corresponding current flow control devices to provide a circuit of the type described featuring improved performance with a reduced number of components.

7 Claims, 6 Drawing Figures

DEADZONE CIRCUIT

BACKGROUND OF THE INVENTION

1. Field of the Invention

This invention relates generally to deadzone circuits and particularly to deadzone circuits featuring increased reliability with a reduce number of components. More particularly, a deadzone circuit is provided including saturable amplifiers for providing an output when the input to the circuit is above predetermined deadzone levels.

2. Description of the Prior Art

Deadzone circuits are frequently used in multichannel servo systems. In these systems force feedback has the effect of deteriorating the force gradient and thus detracting from the effectiveness of the system. Deadzone circuits are utilized to provide a zone of operation where there is no such detracting force feedback. Prior to the present invention such deadzone circuits required a multiplicity of components and the desired level of performance was difficult to achieve. Moreover, aircraft control systems and the like require that the deadzone characteristic be accomplished with reliability and in a small package. The device of the present invention achieves these results.

SUMMARY OF THE INVENTION

This invention contemplates a deadzone circuit including a first amplifier saturated in a negative sense and a second amplifier saturated in a positive sense. A pair of current flow control devices, each connected to one of the aforementioned amplifiers, are reversed biased so that a third amplifier driven by said devices provides a null output for an input within a defined deadzone. This output remains at null until the input is greater than the deadzone level, whereupon the second amplifier becomes unsaturated and swings negative. The current flow control device connected to the second amplifier is thereupon forward biased and the output of the third amplifier follows the output of the current flow control device. For negative inputs operation of the circuit is similar, except when the negative input is greater than the deadzone level the first amplifier becomes unsaturated and swings positive.

The main object of this invention is to provide a deadzone circuit featuring improved performance with a reduced number of components.

Another object of this invention is to provide a circuit of the type described including saturated amplifiers and means arranged therewith to provide a null output when the input to the amplifiers is within predetermined levels.

Another object of this invention is to arrange the saturated amplifiers so that they operate in their linear region.

Another object of this invention is to provide a pair of amplifiers each saturated in opposite senses and connected through initially reverse biased current flow control devices to a third amplifier so that the third amplifier provides a null output. Upon the input to the pair of amplifiers exceeding predetermined deadzone levels one of the amplifiers, depending on the sense and level of the input signal, becomes saturated and the output of the third amplifier follows the output of the unsaturated amplifier applied through its corresponding current flow control device.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
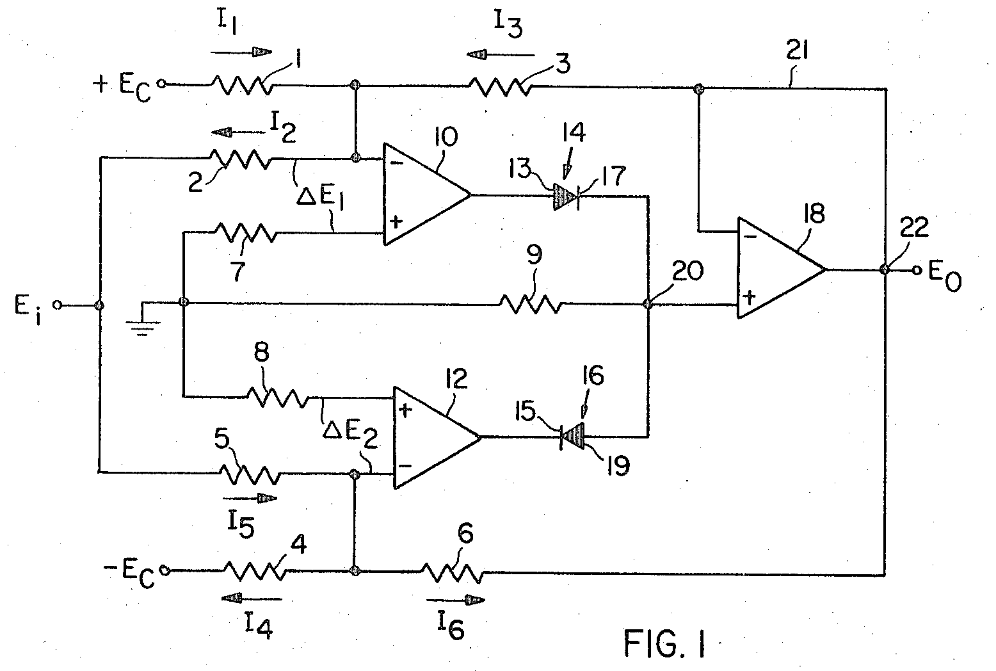
FIG. 1 is a circuit diagram of a deadzone circuit according to the invention.

With reference to FIG. 1, a signal $+E_c$ at a predetermined level in a positive sense is applied through a resistor 1 to an inverting input terminal of an amplifier 10. A signal $-E_c$ at the predetermined level in a negative sense is applied through a resistor 4 to an input terminal of an amplifier 12. Signals $+E_c$ and $-E_c$ establish positive and negative deadzone levels as will hereinafter be more fully explained.

An input signal designated as $E_i$, and which signal may be, for purposes of illustration, a control signal is applied through a resistor 2 to the inverting input terminal of amplifier 10 and through a resistor 5 to the inverting input terminal of amplifier 12. The non-inverting input terminals of amplifiers 10 and 12 are grounded through resistors 7 and 8, respectively.

An output terminal of amplifier 10 is connected to an anode 13 of a diode 14 and an output terminal of amplifier 12 is connected to a cathode 15 of a diode 16. Cathode 17 of diode 14 and anode 19 of diode 16 are connected at a point 20, and which point 20 is connected to a non-inverting input terminal of an amplifier 18 and connected to ground through a resistor 9.

Signal $+E_c$ is applied through resistor 1 and through a resistor 3 to an inverting input terminal of amplifier 18 and to a point 22 connected to an output terminal of amplifier 22, and signal $-E_c$ is applied through resistor 4 and a resistor 6 to point 22. An output signal $E_O$ is provided at point 22.

With input currents $I_2 < I_1$ and $I_5 < I_4$, the differential input voltages to amplifier 10 and 12 will be other than zero. Therefore, amplifier 10 will be saturated negatively and amplifier 12 will be saturated positively. Diodes 14 and 16 are reversed biased resulting in the equivalent circuit shown in FIG. 2.

Figure 2:
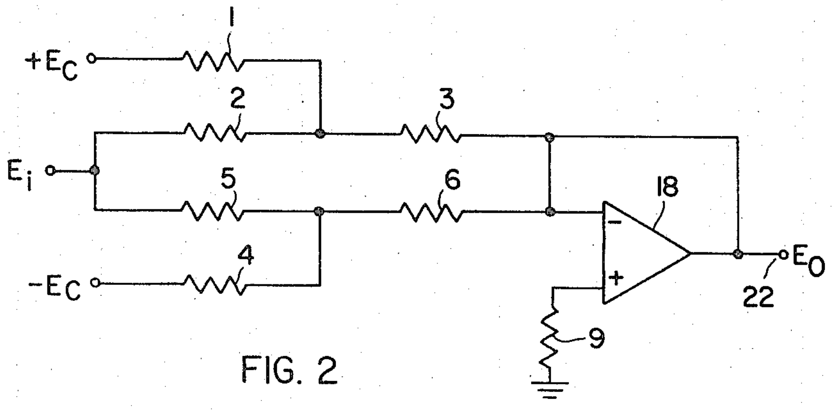
FIG. 2 is a circuit diagram showing a circuit equivalent to that shown in FIG. 1.

The gain of the circuit of FIG. 2 is zero since the feedback resistance of amplifier 18 as provided by a connector 21 is zero. It will now be understood that amplifier 18 operates as a voltage follower and $E_O$ will be at a good null provided both diodes 14 and 16 have low reverse leakage currents.

In order that amplifier 10 (FIG. 1) operate in its linear region the following conditions must be satisfied.

$$I_1 + I_2 + I_3 = O, \quad (1)$$

$$E_1 = O, \text{ where} \quad (2)$$

$$I_1 = E_c/R1 \; I_2 = E_i/R2 \text{ and } I_3 = E_O/R3 \quad (3)$$

By substituting Equation (3) into Equation (1) and simplifying, the following is obtained:

$$E_O = -E_i \cdot R_3/R_2 - E_c \cdot R_3/R_1 \quad (4)$$

From Equation 4 it is evident that the input voltage at which amplifier 10 begins to operate linearly occurs when $E_O = 0$ volts (+). Therefore, the negative break point or deadzone voltage is as follows:

$$E_i = -E_c \cdot R_2/R_1 \quad (5)$$

it may also be seen from Equation 4 that the gain of the circuit is simply $K = -R_3/R_1$.

Figure 3:
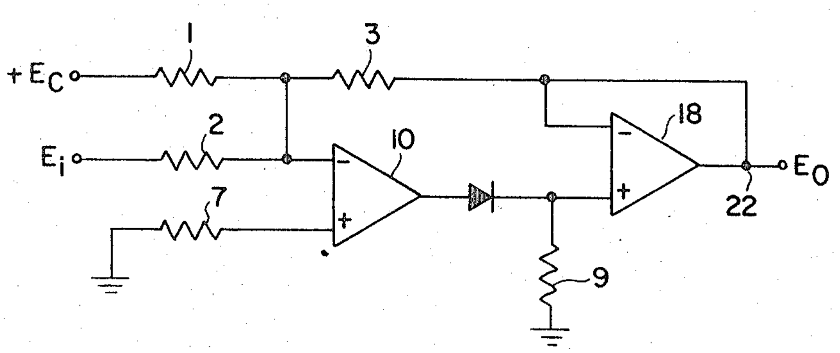
FIG. 3 is a circuit diagram showing another circuit equivalent to that shown in FIG. 1.

When amplfier 12 becomes saturated positively due to its differential input voltage being other than zero, diode 16 is reverse biased, preventing amplifier 12 from affecting $E_O$. An equivalent circuit for this condition is shown in FIG. 3. Since diode 14 and resistor 9 are in the forward loop, their effect on the circuit is neglible. Amplifier 18 continues to operate as a voltage follower.

The same analysis as previously made holds true for positive input signals, except that amplifier 12 is now in its linear region and amplifier 10 is saturated negatively. The output equation is as follows:

$$E_O = -E_i \cdot R_6/R_5 + E_c \cdot R_6/R_4 \quad (6)$$

the gain may be expressed as $K = -R_6/R_5$, and the positive break point or deadzone voltage may be expressed as follows:

$$E_i = E_c \cdot R_5/R_4 \quad (7)$$

Figure 4A:
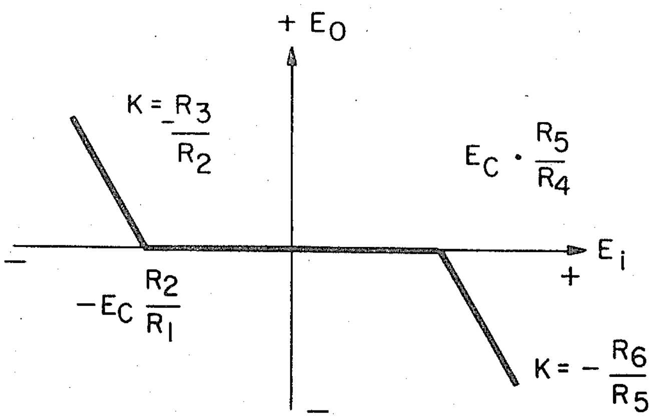
FIG. 4A is a graphical representation showing the relationship of the input and output voltages of the circuits shown in FIGS. 1, 2, and 3 with operation centered about zero input voltage.

The graphical representation of FIG. 4A shows the relationship between $E_i$ and $E_O$ in terms of the circuit resistors. For various conditions of input voltages $E_i$, the output voltage may be expressed as follows:

$$\text{For } E_i \quad V_c \cdot R_5/R_4,\; E_O = -E_i \cdot R_6/R_5 + E_c \cdot R_6/R_4 \quad (8)$$

$$\text{For } -E_c \cdot R_2/R_1 < E_i < E_c \cdot R_5/R_5,\; E_O = O \quad (9)$$

$$\text{For } E_i \quad -E_c \cdot R_2/R_1,\; E_O = -E_i \cdot R_3/R_2 - E \cdot R_3/R_1 \quad (10)$$

Figure 4B:
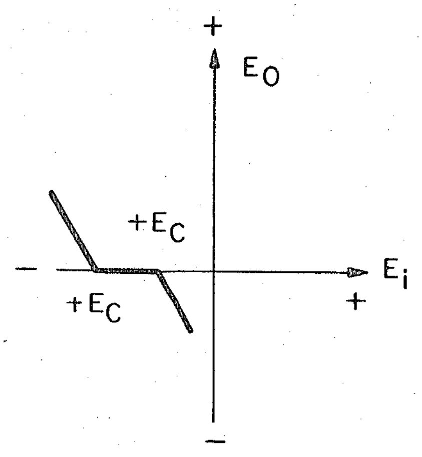
FIG. 4B is a graphical representation showing the relationship of the input and output voltages with operation centered about a negative input voltage.
Figure 4C:
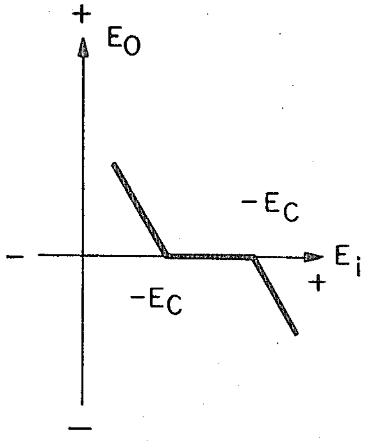
FIG. 4C is a graphical representation showing the relationship of the input and output voltages with operation centered about a positive input voltage.

It should be noted that the device does not have to operate centered about zero input voltage as shown in FIG. 4. Operation could be centered about any positive or negative input voltages, depending on the sense and magnitude of the biasing voltages ($\pm E_c$) as shown in FIGS. 4B and 4C.

It will now be seen that the aforenoted objects of the invention have been met. With zero input or with an input less than the deadzone level, amplifiers 10 and 12 are both saturated. Amplifier 10 is saturated negative because of a positive bias at its inverting input terminal applied through resistor 1 and amplifier 12 is saturated positive because of a negative bias on its inverting input applied through resistor 4. This causes diodes 14 and 16 to be reverse biased to produce a null output $E_O$ at point 22.

For a positive input voltage $E_i$, the output will remain at null until the input equals $E_c \cdot R_5/R_4$. Amplifier 12 thereupon becomes saturated and its output swings negative, forward biasing diode 16. Amplifier 18, which operates as a voltage follower, follows the voltage at the anode of diode 16. Overall feedback around amplifiers 12 and 18 is provided through resistor $R_6$ with the gain being $K = -R_6/R_5$. For negative inputs $E_i$, the circuit operates in a similar manner, utilizing amplifier 10 instead of amplifier 12. The break or deadzone voltage is $E_c \cdot R_2/R_1$, with the gain after the break point being $K = -R_3/R_2$.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A deadzone circuit comprising:

means for providing an input signal;

means for providing a biasing signal;

amplifier means connected to the input signal means and to the biasing signal means and responsive to the signal therefrom for providing a saturated output when the input signal is within a predetermined deadzone, and for providing an unsaturated output when the input signal is outside the deadzone;

output means connected to the amplifier means and responsive to the saturated output therefrom for providing a null output, and responsive to the unsaturated output for providing an output which follows said unsaturated output; and the amplifier means including a first amplifier connected at its input to the biasing means and biased by the signal therefrom to provide a saturated output in one sense and a second amplifier connected at its input to the biasing means and biased by the signal therefrom to provide a saturated output in an opposite sense when the input signal is within the predetermined deadzone.

2. A deadzone circuit as described by claim 1, wherein:

the second amplifier becomes unsaturated and swings to the one sense when the input signal is outside the predetermined deadzone in the opposite sense; and the first amplifier becomes unsaturated and swings to the opposite sense when the input signal is outside the predetermined deadzone in the one sense.

3. A deadzone circuit as described by claim 2, including:

a first resistor for connecting the input signal means to the input of the first amplifier;

a second resistor for connecting the biasing means to the input of the first amplifier;

a third resistor for connecting the input signal means to the input of the second amplifier;

a fourth resistor for connecting the biasing means to the input of the second amplifier;

the second amplifier becoming unsaturated and swinging to the one sense when the input signal equals the biasing voltage times the ratio of the third to fourth resistors; and the first amplifier becoming unsaturated and swinging to the opposite sense when the input signal equals the biasing voltage times the ratio of the second to first resistors.

4. A deadzone circuit as described by claim 1, wherein the output means connected to the amplifier means and responsive to the saturated output therefrom for providing a null output, and responsive to the unsaturated output for providing an output which follows said unsaturated output includes:

a first current flow control device connected to the output of the first amplifier and reverse biased by the saturated output in the one sense therefrom, and forward biased when said amplifier becomes unsaturated and swings to to the opposite sense;

a second current flow control device connected to the output of the second amplifier and reversed biased by the saturated output in the opposite sense therefrom, and forward biased when said amplifier becomes unsaturated and swings to the one sense; and an amplifier connected at its input to the first and second current flow control devices for providing an output which follows the output of one of the first and second amplifiers when the current flow control device connected thereto is forward biased.

5. A deadzone circuit as described by claim 1, wherein:

the biasing means includes means for biasing the first amplifier in the opposite sense and means for biasing the second amplifier in the one sense.

6. A deadzone circuit as described by claim 5, wherein:

the first amplifier has an inverting input terminal and the second amplifier has an inverting input terminal:

a first resistor connects the inverting input terminal of the first amplifier to the biasing means in the opposite sense;

a second resistor connects the inverting input terminal of the second amplifier to the biasing means in the one sense;

a first feedback resistor connects the output means to the inverting input terminal of the first amplifier;

a second feedback resistor connects the output means to the inverting input terminal of the second amplifier;

a third resistor connects the input signal source to the inverting input terminal of the first amplifier; and a forth resistor connects the input signal source to the inverting input terminal of the second amplifier.

7. A deadzone circuit responsive to an input signal from a signal source, comprising:

a first amplifier connected to the input signal source and responsive to the input signal for being saturated in one sense when said input signal is within a predetermined deadzone;

a second amplifier connected to the input signal source and responsive to the input signal for being saturated in an opposite sense when said input signal is within the deadzone;

a first current flow control device connected to the first amplifier and reverse biased by the saturated output therefrom;

a second current flow control device connected to the second amplifier and reverse biased by the saturated output therefrom;

a third amplifier connected to the first and second reverse biased current flow control devices and responsive to the first and second amplifier outputs applied therethrough for providing a null output;

one of the first and second amplifiers becoming unsaturated when the input signal is outside of the predetermined deadzone for forward biasing the current flow control device connected thereto; and the third amplifier being responsive to the output through said current flow control device for providing an output which follows the output from the unsaturated amplifier.

* * * * *